United States Patent [19]
Toko

[11] Patent Number: 5,434,495
[45] Date of Patent: Jul. 18, 1995

[54] COGNITION DEVICE FOR BATTERY RESIDUAL CAPACITY

[75] Inventor: Yoshio Toko, Hyogo, Japan

[73] Assignee: Mitsubishi Denki Kabushiki Kaisha, Tokyo, Japan

[21] Appl. No.: 426,757

[22] Filed: Oct. 26, 1989

[30] Foreign Application Priority Data

Mar. 31, 1989 [JP] Japan .................. 1-82866

[51] Int. Cl.⁶ .............................................. H02J 7/04
[52] U.S. Cl. ............................ 320/44; 320/48; 324/427
[58] Field of Search ............ 320/31, 32, 35, 44, 320/48, 30, 33, 34, 39, 40; 324/426, 427, 429, 431, 433

[56] References Cited

U.S. PATENT DOCUMENTS

| | | | |
|---|---|---|---|
| 4,377,787 | 3/1983 | Kikuoka et al. | 324/431 |
| 4,387,334 | 6/1983 | Loper | 320/44 |
| 4,455,523 | 6/1984 | Koenck | 320/48 X |
| 4,677,363 | 6/1987 | Kopmann | 320/48 X |
| 4,725,784 | 2/1988 | Peled et al. | 320/48 X |
| 4,775,827 | 10/1988 | Ijntema et al. | 320/48 X |
| 4,820,966 | 4/1989 | Fridman | 320/44 X |
| 4,843,299 | 6/1989 | Hutchings | 320/31 |
| 4,947,123 | 8/1990 | Minezawa | 324/427 |
| 4,965,738 | 10/1990 | Bauer et al. | 320/48 X |

FOREIGN PATENT DOCUMENTS

| | | |
|---|---|---|
| 0280916 | 2/1988 | European Pat. Off. . |
| 2176902 | 1/1987 | United Kingdom ............ 324/426 |
| 8302005 | 6/1983 | WIPO ............................... 320/48 |

Primary Examiner—Kristine L. Peckman
Attorney, Agent, or Firm—Rothwell, Figg, Ernst & Kurz

[57] ABSTRACT

In a cognition device for battery residual capacity, battery voltage information and battery ambient temperature information are input to a microprocessor through an A/D converter. In the microprocessor, the voltage information is corrected with load information; the data conforming to the ambient temperature information are read out of the battery discharge characteristic data which are previously stored in memory, and the read-out data are compared with the corrected voltage information so that the battery residual capacity can be computed from the result of the above comparison data. In this arrangement, it is therefore possible to accurately recognize battery residual capacity at an arbitrary point in time.

7 Claims, 6 Drawing Sheets

COGNITION DEVICE FOR BATTERY RESIDUAL CAPACITY

BACKGROUND OF THE INVENTION

1. Field of the Invention

The present invention relates to a cognition device for battery residual capacity, especially useful for portable wireless equipment or office automation equipment.

2. Description of the Prior Art

Conventional cognition devices for battery residual capacity have used a device which directly measures the residual capacity or a device in which residual capacity is obtained from consumed electric power obtained by integrating current during the time which a battery is used with a timer.

In conventional cognition devices for battery residual capacity as described above, there has been a problem that battery residual capacity cannot be measured accurately due to changes in battery voltage resulting from changes in ambient temperature or load.

Japanese Patent Application laid-open No. 218077/85 describes a method of temperature correction for such a condition. In this method, a correction factor is calculated by using the temperature difference between the ambient reference temperature of 20° C. and the ambient temperature at that time, but the correction for the temperature changes is too rough to obtain accurate residual capacity.

SUMMARY OF THE INVENTION

The present invention is directed toward solving such problems as described above. It is therefore an object of the invention to provide a cognition device for battery residual capacity with which the battery residual capacity at any arbitrary point of time can be determined correctly without being influenced by ambient temperature or load.

The cognition device for battery residual capacity comprises, in one embodiment of the invention, an A/D converter to convert the voltage information of the battery and the ambient temperature information of the battery into digital signals, and a central control circuit which corrects the voltage information with the load information and reads out the data conforming to the ambient temperature information from the discharge characteristic data previously stored in memory to compare the data with the voltage information after correction and calculate battery residual capacity based on the comparison data.

Other objects and advantages of the present invention will be made clearer by the following detailed description with reference to the accompanying drawings.

PREFERRED EMBODIMENT OF THE INVENTION

Figure 1:
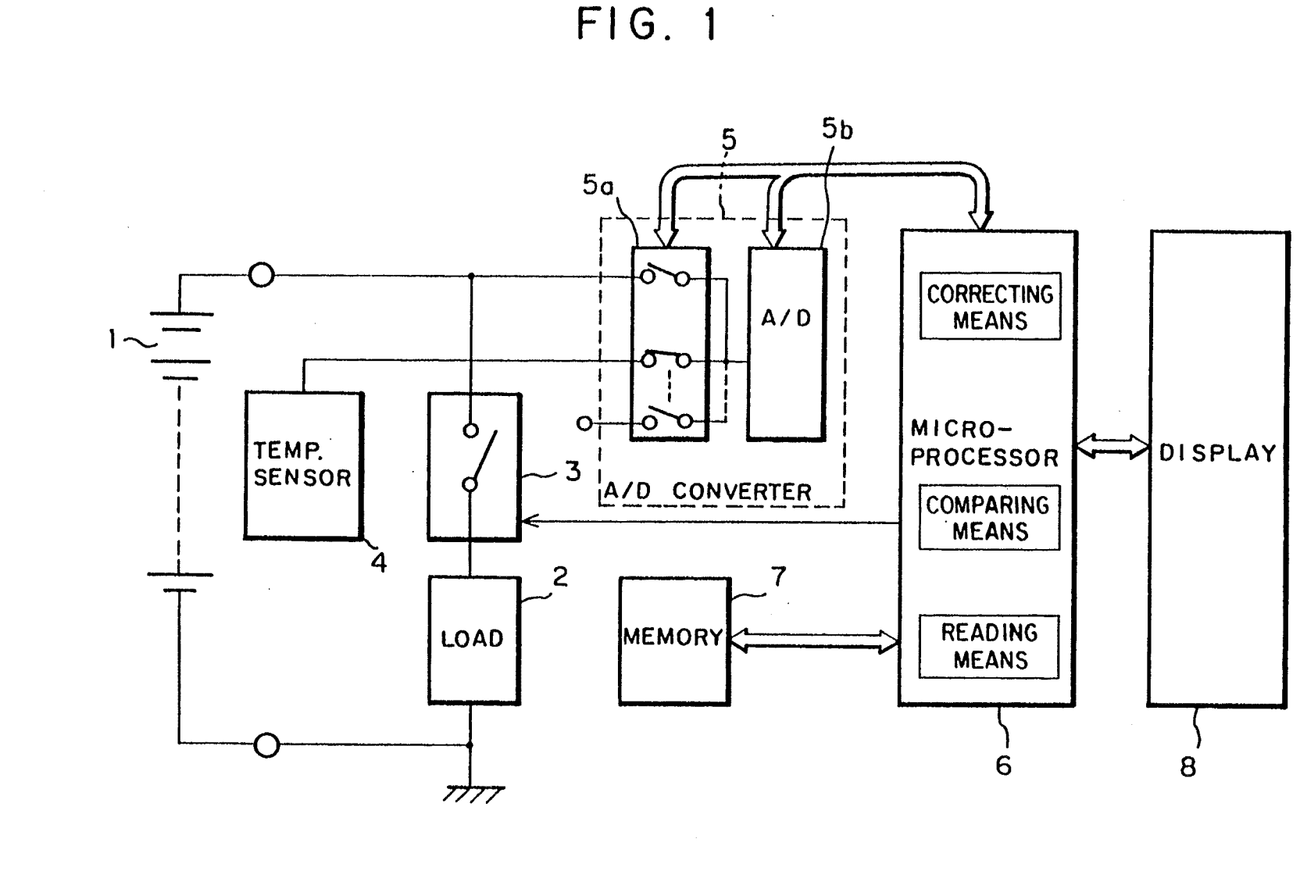
FIG. 1 is a block diagram showing a cognition device for battery residual capacity according to one embodiment of the present invention.

In FIG. 1, a secondary battery 1, for example, of a Ni—Cd type is connected to supply a load 2, which may be, for example, the internal circuit of an electronic device. An electronic switch 3 is connected between the battery 1 and the load 2. A temperature sensor 4 is provided physically close to the battery 1. An A/D (analog-digital) converter 5 for converting the outputs of the battery 1 and of the sensor 4 comprises an analog switch section 5a having a plurality of selectively connectable switch nodes and which switches over to the output of the battery 1 or that of the temperature sensor 4. An A/D converter section 5b, which performs A/D conversion, is connected to the analog switch section 5a.

A component part 6 is a microprocessor which reads data from the A/D converter 5 and controls the electronic switch 3. A nonvolatile memory 7 (hereinafter referred to as a memory) in which a program for normal operation of the electronic device and the discharge characteristic data of the battery are stored and a display 8 which displays battery residual capacity are connected to the microprocessor 6.

Figure 2:
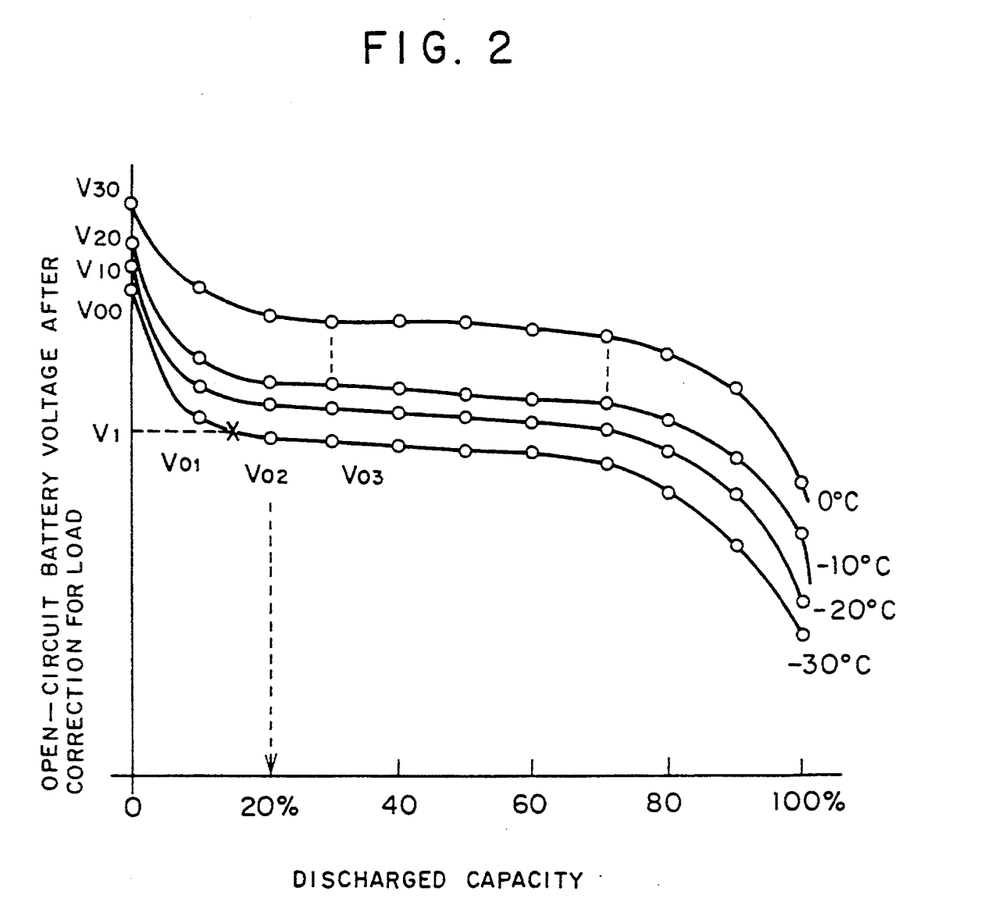
FIG. 2 is a discharge characteristic chart of a battery voltage.

FIG. 2 shows the discharged capacity as a function of battery voltage at temperature differences of 10° C. apart for a Ni—Cd secondary battery. In FIG. 2, the battery voltage is the open-circuit voltage at no load and discharged capacity values at 10% capacity intervals are plotted with marks o's.

A table shown below expresses the characteristics shown in FIG. 2 in a matrix form in which battery voltages ($V_{NM}$) corresponding to individual temperatures at intervals of 10° C. and discharged capacity values at intervals of 10% are plotted. The voltage data in matrix form as mentioned above are stored in a specific address area of the memory 7 shown in FIG. 1. In the example shown in the table, 10×10 data are shown.

| Temperature | Value of temp. sensor output | Value of open-circuit battery volt. for respective percentage values of discharge capacity at respective temperatures | | | | | | |
|---|---|---|---|---|---|---|---|---|
| | | 0% | 10% | 20% | 30% | ... | 80% | 90% |
| −30° C. | $T_0$ | $V_{00}$ | $V_{01}$ | $V_{02}$ | $V_{03}$ | ... | $V_{08}$ | $V_{09}$ |
| −20° C. | $T_1$ | $V_{10}$ | $V_{11}$ | $V_{12}$ | . | ... | . | . |
| −10° C. | $T_2$ | $V_{20}$ | $V_{21}$ | $V_{22}$ | . | ... | . | . |
| 0° C. | $T_3$ | . | . | . | ($V_{NM}$) | | | |
| . | . | . | . | . | . | | | |
| . | . | . | . | . | . | | | |
| . | . | . | . | | | | | |
| 60° C. | $T_9$ | $V_{90}$ | $V_{91}$ | | | | | |

Following is the explanation of operation in the embodiment as described above referring to the flow chart shown in FIG. 3. The microprocessor 6 controls the analog switch section 5a of the A/D converter 5 to measure a battery voltage (step ST1), controls the A/D converting section 5b as to perform A/D conversion, and reads converted data (step ST2).

Figure 3:
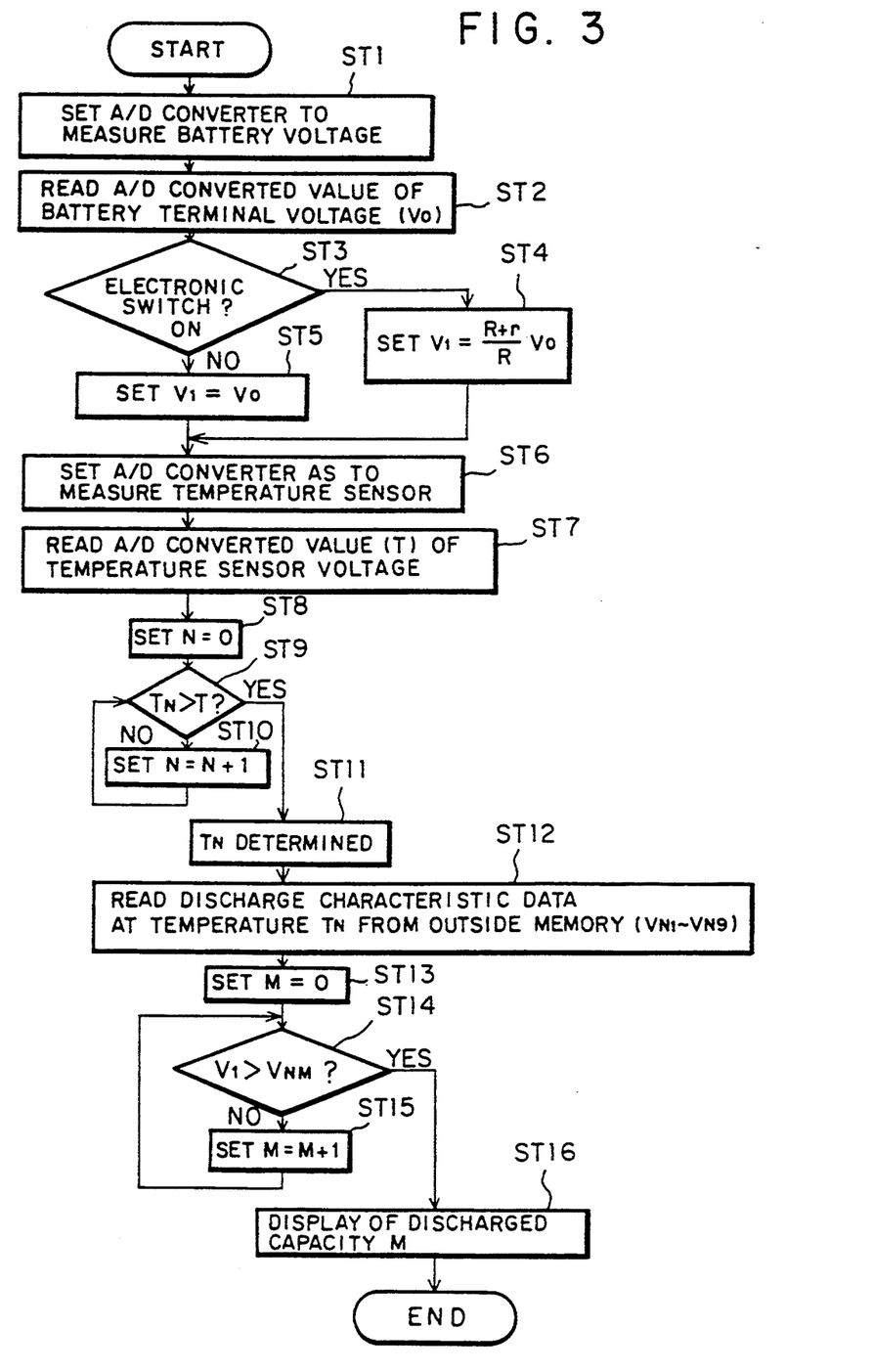
FIG. 3 is a flow chart explaining the operation of the device shown in FIG. 1.

The value of the read converted data is denoted $V_0$. At this point, the control condition of the switch 3 shall be judged (step ST3), if it is in ON state, a voltage drop due to a load shall be used to correct the value of open-circuit voltage. The corrected voltage $V_1$, which is the open-circuit voltage, is obtained from the equation $$V_1 = V_0 \times (R+r)/R \qquad \text{(step ST4)},$$

where

R is the load resistance and r is the internal resistance of a battery.

On the other hand, if the electronic switch is in the OFF state:

$$V_1 = V_0 \qquad \text{(step ST5)}$$

At step ST6, the A/D converter is set to read the temperature from the output of the temperature sensor 4. The measured temperature T is compared with stored data for stored temperature values T1, T2, T3, ... successively, to retrieve $T_N$ which is the closest to the measured data (steps ST7 to ST11). The measured data $T \cong T_N$, is obtained, and battery voltages $V_{NO}$ to $V_{N9}$ corresponding to the memorized data TN on the table are read from the memory 7 (step ST12). The read data are compared successively with the above mentioned corrected measured voltage $V_1$ to retrieve $V_{NM}$ (steps ST13 to ST15). The discharged capacity is equal to $M \times 10(\%)$ and this value is displayed on display 8 at step ST16. The residual capacity is, therefore, obtained in the expression $100 - M \times 10(\%)$.

An example is shown in the following. In FIG. 2, for example, when $T \cong -30°$ C., a point to be $V_l$ on the line of $-30°$ C. is shown with x.

By successive comparison of voltage as described in the above, the voltage value becomes $V_{02}$, and the discharge capacity is 20%. The residual value is, therefore, 80%.

The microprocessor 6 displays the battery residual capacity thus obtained in the display 8 in the form of a digital value or of a bar graph or the like.

The operation of cognition and display of battery residual capacity may be renewed at regular intervals of time or when a user executes a specific operation. For example, during normal program execution of the electronic device, the microprocessor may be switched to a mode of battery residual capacity cognition and display by an interrupt control.

In the above example, 10 temperature parameters and 10 discharge parameters for a total of $10 \times 10 = 100$ voltage data are used, but to upgrade precision, for example, if 20 temperature parameters, in the range of $-30$ to $+55°$ C. at intervals of 5° C. and 20 discharge capacity parameters at intervals of 5%, that is, a total of $20 \times 20 = 400$ voltage data are used, a measurement can be made with double the precision for temperature and also for load.

Figure 4:
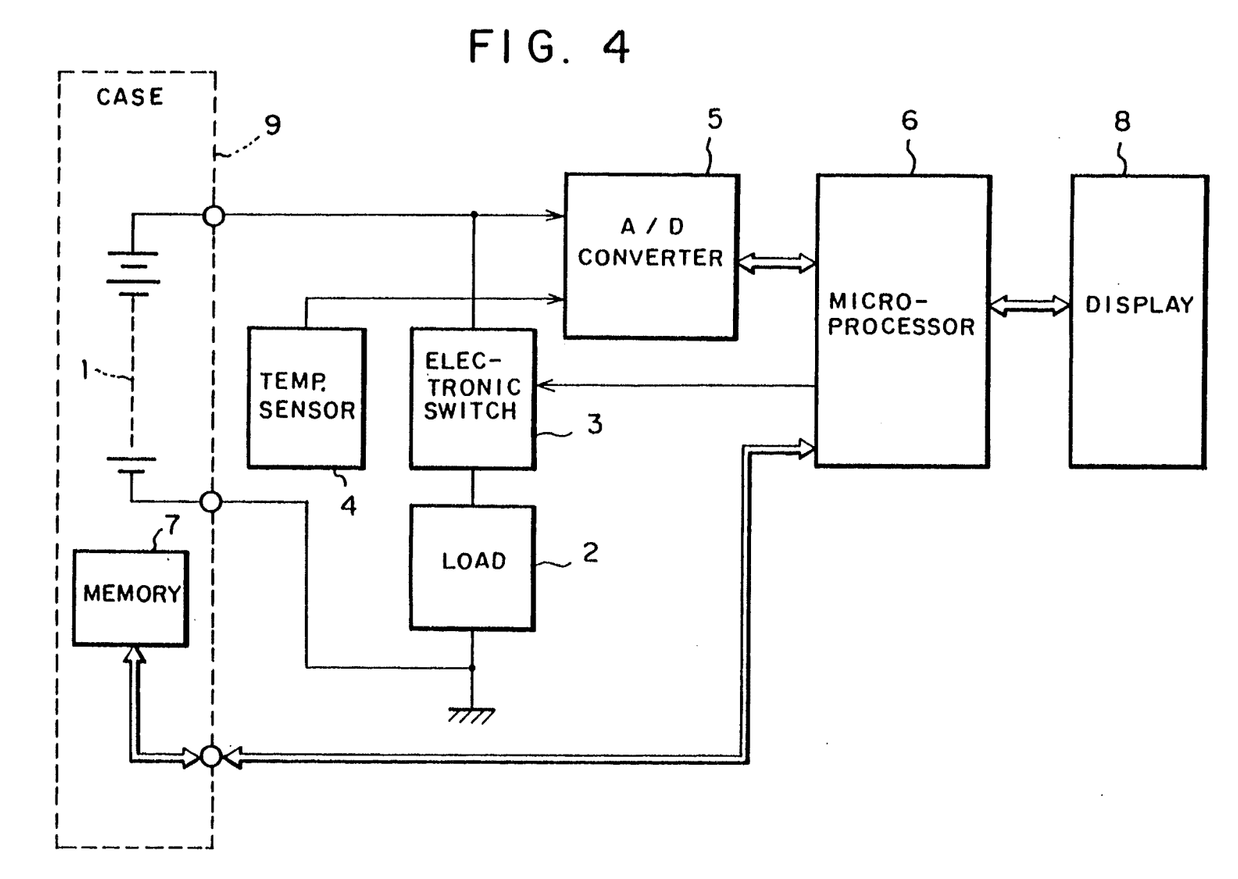
FIG. 4, FIG. 5 and FIG. 6 are block diagrams showing cognition devices for battery residual capacity according to other embodiments of the present invention.

FIG. 4 shows an embodiment in which the battery 1 and the memory 7 are integrated into a single case 9 made attachable to and detachable from the electronic device shown as a load 2. According to this example, the discharge characteristic data conforming to the type of battery 1 can be stored in the memory 7, so that a battery can be selected and exchanged freely out of various kinds of batteries for electronic devices. The remaining capacity cognition components can be provided with the electronic device.

Figure 5:
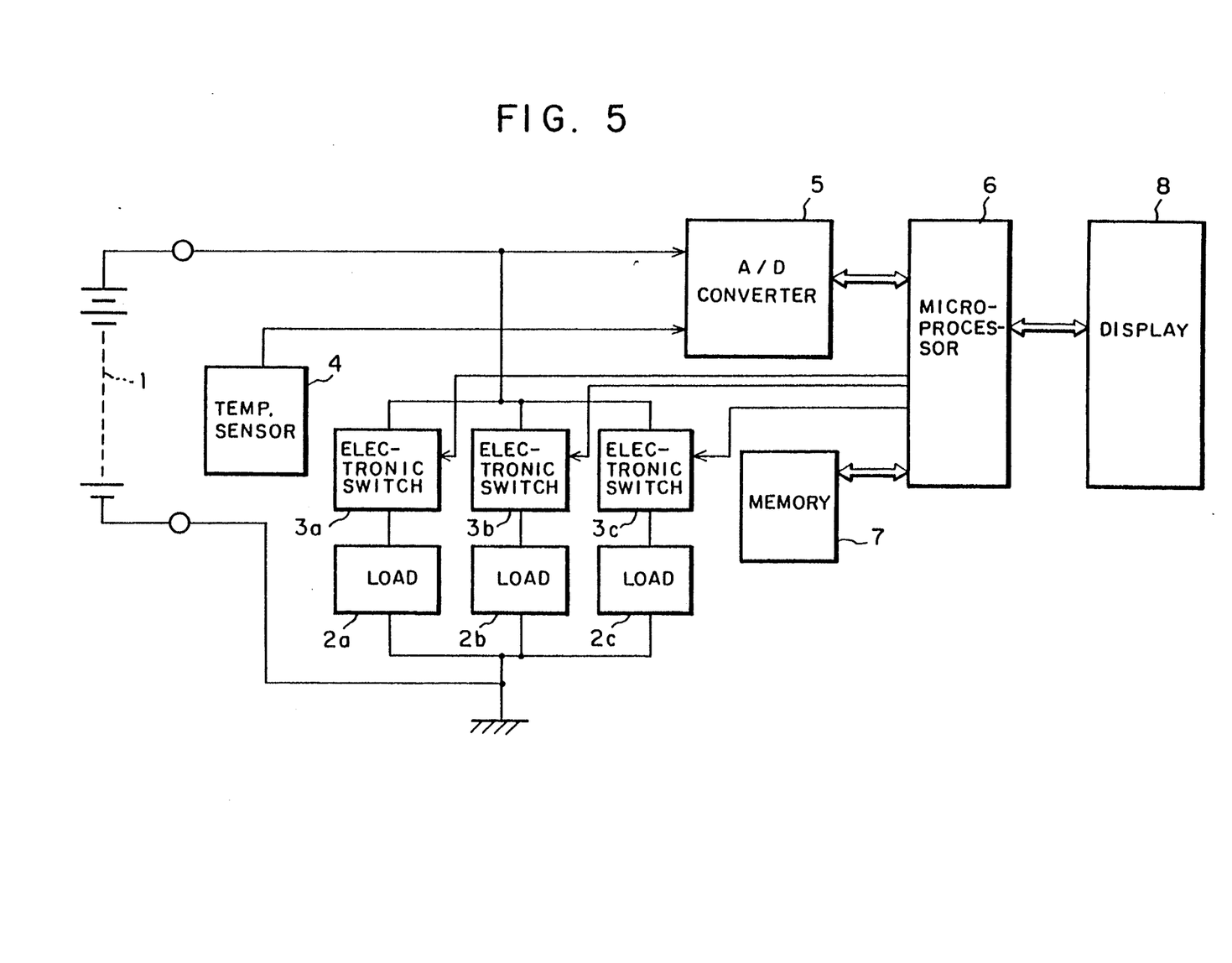

FIG. 5 shows an embodiment in which a plurality of loads 2a-2c are connected to a battery 1 in parallel through respective independent electronic switches 3a-3c for exclusive use. In this case, all electronic switches 3a-3c are controlled by microprocessor 6. The microprocessor 6 can, therefore, always recognize an overall load based on the state of electronic switches 3a-3c controlled by the microprocessor, and the battery voltage can be corrected accordingly.

Figure 6:
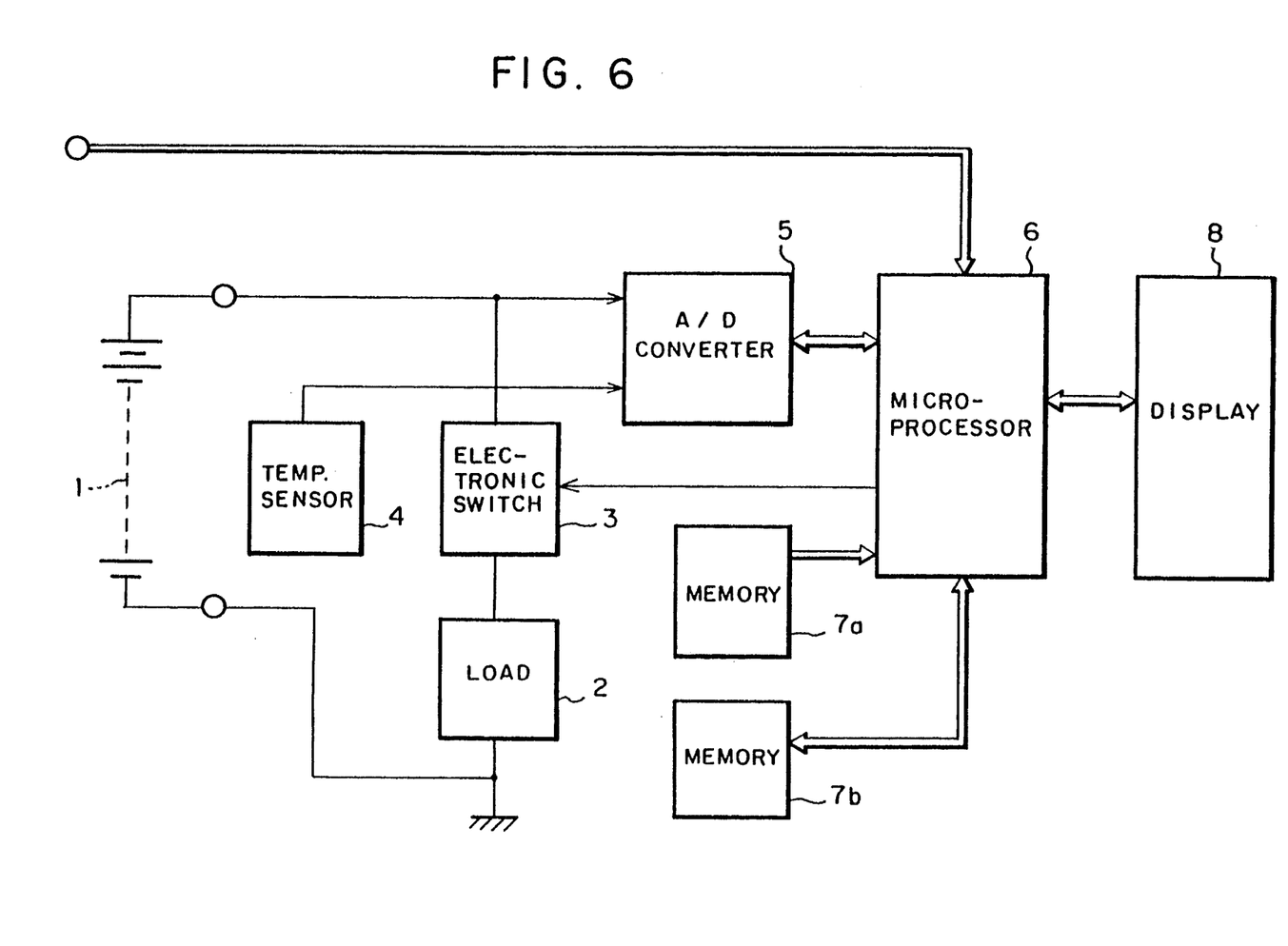

FIG. 6 shows an embodiment in which a memory 7a storing a control program and a memory 7b storing discharge characteristics are independently provided. In this case, if the memory 7b has read-write capability to store external input data through the microprocessor 6, the exchange of discharge characteristics is easily done according to the type of battery utilized at any given time.

The detailed drawings of A/D converters 5 in the embodiments shown in FIG. 4–FIG. 6 are omitted since each of them comprises an analog switch section 5a and an A/D conversion section 5b as shown in FIG. 1.

According to the present invention, a measured battery voltage can be corrected by load information and the corrected voltage is compared with the temperature correlated data read from the discharge characteristic data of a battery stored in a memory to determine the discharged capacity of the battery. Correct cognition of battery residual capacity can be performed based on the determined discharged capacity.

What is claimed is:

1. A device for determining residual capacity of a battery, comprising:
    means for sensing output voltage of a battery;
    means for sensing ambient temperature of said battery;
    means for storing discharge characteristic data relating to the energy storage characteristics of said battery;
    means for correcting the sensed output voltage of said battery by an amount proportional to a load across said battery;
    means for reading characteristic data from said storing means corresponding to said sensed ambient temperature; and
    means for comparing said read characteristic data with said corrected output voltage and computing the residual capacity of said battery based on the characteristic data matching said corrected output voltage.

2. A device according to claim 1, wherein said means for sensing output voltage and means for sensing ambient temperature are connected to analog-to-digital (A/D) converter means including switch means for switching between voltage and temperature measurement and converting measured values into digital data; and
    said means for correcting, means for reading, and means for comparing comprise a microprocessor and associated program instructions for controlling the operation of said microprocessor.

3. A device according to claim 2, wherein said microprocessor controls the operation of said A/D converter means.

4. A device according to claim 1, wherein said means for storing comprises a memory device, said memory device being integrated with said battery as an indivisible unit.

5. A device according to claim 2, further comprising a plurality of load switch means for connecting a plurality of loads to said battery respectively;
    said microprocessor controlling the operation of said load switch means and correcting the sensed output voltage according to the number of loads connected across said battery.

6. A device according to claim 2, wherein said means for storing comprises a read-write memory, and said microprocessor includes means for writing discharge characteristic data into said memory to be stored therein according to the particular type of battery being used to drive said load.

7. A method for determining residual capacity of a battery, comprising the steps of:
  storing discharge characteristic data relating to the energy storage characteristics of a battery;
  sensing output voltage of said battery;
  sensing ambient temperature of said battery;
  correcting the sensed output voltage of said battery by an amount proportional to a load across said battery;
  reading stored discharge characteristic data corresponding to said sensed ambient temperature; and
  comparing said read discharge characteristic data with said corrected output voltage and computing the residual capacity of said battery based on the discharge characteristic data matching said corrected output voltage.

* * * * *

UNITED STATES PATENT AND TRADEMARK OFFICE
CERTIFICATE OF CORRECTION

PATENT NO. : 5,434,495
DATED : July 18, 1995
INVENTOR(S) : Yoshio Toko

It is certified that error appears in the above-indentified patent and that said Letters Patent is hereby corrected as shown below:

Col. 2, line 15, after "4" insert --for purposes of the presents invention --, Col. 3, line 19, "TN" should be -- $T_N$ --.

Signed and Sealed this

Ninth Day of January, 1996

Attest:

BRUCE LEHMAN

Attesting Officer     Commissioner of Patents and Trademarks